United States Patent
Ragone et al.

(10) Patent No.: US 7,521,983 B2
(45) Date of Patent: Apr. 21, 2009

(54) HIGH-VOLTAGE SWITCH WITH LOW OUTPUT RIPPLE FOR NON-VOLATILE FLOATING-GATE MEMORIES

(76) Inventors: Giancarlo Ragone, Vico III Micare, 43, Roccella Jonica (IT) 89047; Luca Crippa, Via Manzoni, 66, Busnago (IT) 20040; Miriam Sangalli, Via XXV Aprile, 11D, Carugate (IT) 20061; Rino Micheloni, Via Luini, 11, Turate (IT) 22078

( * ) Notice: Subject to any disclaimer, the term of this patent is extended or adjusted under 35 U.S.C. 154(b) by 39 days.

(21) Appl. No.: 11/437,405

(22) Filed: May 19, 2006

(65) Prior Publication Data

US 2007/0053227 A1  Mar. 8, 2007

(30) Foreign Application Priority Data

May 20, 2005  (EP) ............................... 05425347.1

(51) Int. Cl.
H03K 17/687 (2006.01)
(52) U.S. Cl. .................. 327/427; 327/536; 327/537
(58) Field of Classification Search ............. 327/427, 327/430–437, 536–537; 307/449; 326/88; 365/230.06, 185.17, 200
See application file for complete search history.

(56) References Cited

U.S. PATENT DOCUMENTS

| | | | |
|---|---|---|---|
| 4,692,638 A | 9/1987 | Stiegler | 307/449 |
| 5,426,334 A | 6/1995 | Skovmand | 327/427 |
| 5,559,452 A | 9/1996 | Saito | 326/88 |
| 5,604,711 A * | 2/1997 | Cheung | 365/230.06 |
| 5,801,579 A * | 9/1998 | Le et al. | 327/537 |
| 6,549,461 B2 | 4/2003 | Park et al. | 365/185.17 |
| 6,975,161 B2 * | 12/2005 | Yen | 327/536 |
| 2002/0036936 A1 | 3/2002 | Park et al. | 365/200 |
| 2003/0122611 A1 | 7/2003 | Min | 327/536 |
| 2004/0104761 A1 | 6/2004 | Yen | 327/536 |

FOREIGN PATENT DOCUMENTS

EP  0 485 016 A2  5/1992

OTHER PUBLICATIONS

Ahmad, T., et al., "High Voltage DC-DC Converter Using Post-Processed Integrated Capacitor Technology on SOI," *Univ. Arkansas, Dept. of Electrical Engineering*, 1 page.

Dickson, J., "On-Chip High-Voltage Generation in MNOS Integrated Circuits Using an Improved Voltage Multiplier Technique," *IEEE J. Solid State Circuits*, SC-11(3):374-378, Jun. 1976.

(Continued)

*Primary Examiner*—Tuan Lam
*Assistant Examiner*—Diana J Cheng
(74) *Attorney, Agent, or Firm*—Schwabe Williamson & Wyatt (57) ABSTRACT

A high-voltage switch has a high-voltage input terminal, receiving a high voltage, and an output terminal. A pass transistor, having a control terminal, is connected between the high-voltage input terminal and the output terminal. The output of a voltage-multiplying circuit of the charge-pump type is connected to the control terminal. The voltage-multiplying circuit is of a symmetrical type, has first and second charge-storage means, receiving a clock signal of a periodic type, and has a first circuit branch and a second circuit branch, which are symmetrical to one another and operate in phase opposition with respect to the clock signal.

22 Claims, 4 Drawing Sheets

OTHER PUBLICATIONS

Favrat, P., et al., "A High-Efficiency CMOS Voltage Doubler," *IEEE J. Solid State Circuits,* 33(3):410-416, Mar. 1998.

Pelliconi, R., et al., Power Efficient Charge Pump in Deep Submicron Standard CMOS Technology, *IEEE J. Solid State Circuits,* 38(6):1068-1071, Jun. 2003.

Pylarinos, L., "Charge Pumps: An Overview," *Univ. Toronto, Dept. of Electrical & Computer Engineering,* 7 pages.

Zhang, M., et al., "Improved Voltage Tripler Structure with Symmetrical Stacking Charge Pump," Electronics Letters, 37(11):668-669, May 24, 2001.

\* cited by examiner

HIGH-VOLTAGE SWITCH WITH LOW OUTPUT RIPPLE FOR NON-VOLATILE FLOATING-GATE MEMORIES

BACKGROUND OF THE INVENTION

1. Field of the Invention

The present invention relates to a high-voltage switch with low output ripple for non-volatile floating-gate memories, in particular for flash memories.

2. Description of the Related Art

As is known, flash memories are currently used in a vast number of electronic apparatuses, such as for example digital cameras, cell phones, and PDAs, for non-volatile data storage. In particular, flash memories offer the advantage of combining a high programming speed with a high storage density.

According to the organization of the memory cells, flash memories are divided into NOR type and NAND type. As is known, NOR-type memories operate at higher speeds, whilst NAND-type memories have lower speeds but a higher data-storage density.

In synthesis, flash memories comprise an array of memory cells organized in rows (wordlines) and columns (bitlines), each of which is formed by a floating-gate transistor. To execute the operations of reading and modifying (erasing or programming) of the memory cells, it is necessary to send high voltages to the terminals of the individual memory cells (by the term "high voltages" reference is made herein to voltages of a value higher than the supply voltage of the memory). For example, in the case of NAND-type flash memories, in order to execute programming of a memory cell it is necessary to send a programming voltage of approximately 20 V to the control gate terminal.

Generally, high voltages are generated via charge-pump circuits, and transmitted to the memory cells via high-voltage switches comprising NMOS or PMOS pass transistor of a high-voltage type. In a known way, if an appropriate control voltage is applied to the gate terminal of each pass transistor, the high-voltage on a first conduction terminal is transmitted to a second conduction terminal, connected to a respective memory cell.

When it is necessary to boost the voltage of the gate terminal of the pass transistor to a value higher than the high voltage received on the first conduction terminal for ensuring complete transfer of the high voltage at output, the high-voltage switches further comprise a voltage-multiplying circuit connected to the gate terminal of the pass transistor. Said condition arises in all cases where the manufacturing technology does not envisage high-voltage P-channel transistors, or else in the case where high-voltage P-channel transistors are available, but a high negative voltage must be transferred at output.

Figure 1:
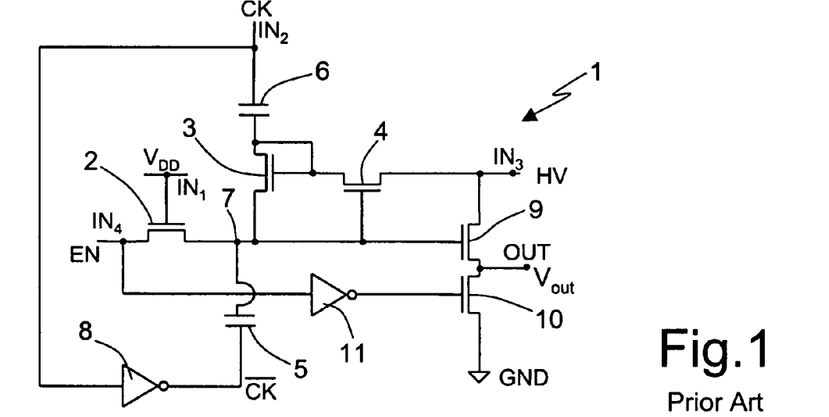
FIG. 1 shows the circuit diagram of a high-voltage switch of a known type.

An example of a high-voltage switch is described in U.S. Pat. No. 6,549,461. This circuit is illustrated in FIG. 1, in which it is designated as a whole by reference number 1.

In detail, the high-voltage switch 1 has a first input terminal $IN_1$, receiving a low supply voltage $V_{DD}$ of, for example, 3 V or less; a second input terminal $IN_2$, receiving a periodic square-wave clock signal CK; a third input terminal $IN_3$, receiving a high voltage HV, having for example a value of 20 V; a fourth input terminal $IN_4$, receiving an enabling signal EN of a logic type, which can assume a first voltage value of 0 V, and a second voltage value, equal to $V_{DD}$; and an output terminal OUT supplying an output signal $V_{out}$.

The high-voltage switch 1 comprises a first NMOS transistor 2, a second NMOS transistor 3, and a third NMOS transistor 4, and a first capacitor 5 and a second capacitor 6.

The first NMOS transistor 2 is connected between the fourth input terminal $IN_4$ and an internal node 7, and has a gate terminal connected to the first input terminal $IN_1$. The first capacitor 5 has a first terminal connected to the internal node 7, and a second terminal connected to the second input terminal $IN_2$ via interposition of a first logic inverter 8, and consequently receiving the negated clock signal $\overline{CK}$. The second capacitor 6 has a first terminal connected to the second input terminal $IN_2$, and a second terminal connected to the internal node 7, via interposition of the second NMOS transistor 3. The second NMOS transistor 3 is diode-connected, and has its gate terminal connected to the third input terminal $IN_3$ via interposition of the third NMOS transistor 4, which in turn has its gate terminal connected to the internal node 7.

The high-voltage switch 1 further comprises a pass transistor 9 of an NMOS type, and a fourth NMOS transistor 10. The pass transistor 9 has its gate terminal connected to the internal node 7, its first conduction terminal connected to the third input terminal $IN_3$, and its second conduction terminal connected to the output terminal OUT. The fourth NMOS transistor 10 is connected between the output terminal OUT and a reference-voltage node GND, and has its gate terminal connected to the fourth input terminal $IN_4$ through a second logic inverter 11.

On the basis of the value of the enabling signal EN, the high-voltage switch 1 enables or not the transfer of the high voltage HV received at input to the output terminal OUT. Thus, operation of the high-voltage switch 1 envisages two operating states, i.e., a "off" operating state, for example with the enabling signal EN having the first value, when the high voltage HV is not transferred at output ($V_{out}$ has an approximately zero value), and a "on" operating state, in the example with the enabling signal EN having the second value, when the high voltage HV is transferred at output ($V_{out}$ has a value approximately equal to HV).

In synthesis, when the enabling signal EN is 0 V, the fourth NMOS transistor 10 conducts and brings the output terminal OUT to the reference voltage GND, so that the output signal $V_{out}$ assumes an approximately zero value ("off" operating state of the high-voltage switch 1). When, instead, the enabling signal EN has a value of $V_{DD}$, the first NMOS transistor 2 conducts, and the internal node 7 reaches a voltage of $V_{DD}-V_{th}$, where $V_{th}$ is the threshold voltage of the first NMOS transistor 2. Then, by application of the clock signal CK to the terminals of the first and second capacitors 5, 6, a charge-pump mechanism is triggered, so that the voltage of the internal node 7 is increased by a value equal to $V_{DD}$ at each cycle of the clock signal CK, until it reaches a boosted value of HV+$V_{DD}$. Said boosted voltage, applied to the gate terminal of the pass transistor 9 enables complete transfer of the high voltage HV to the output terminal OUT, so that the output signal $V_{out}$ assumes a value approximately equal to HV ("on" operating state of the high-voltage switch 1).

Figure 2:
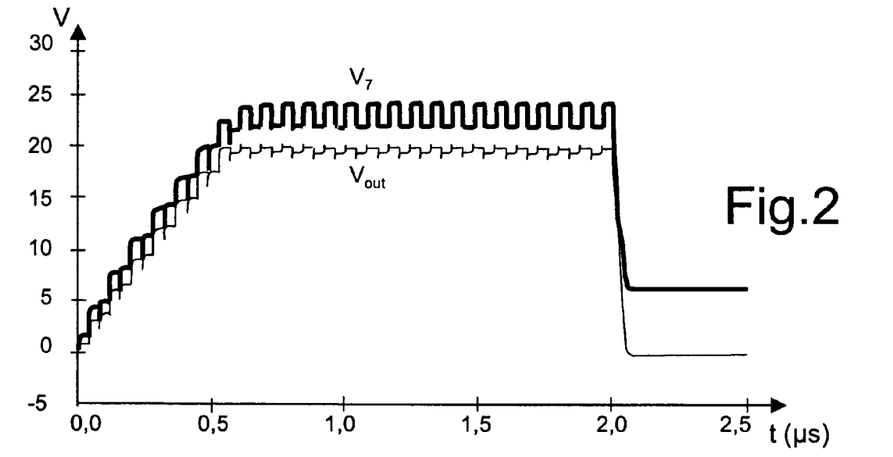
FIGS. 2 and 3 show time plots of circuit quantities of the circuit shown in FIG. 1.
Figure 3:
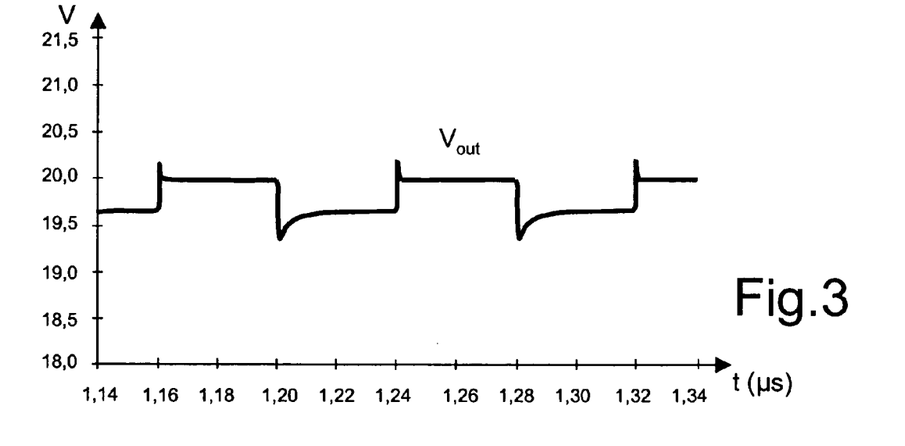

FIG. 2 shows the plot of the output signal $V_{out}$ and of the voltage of the internal node 7, designated by $V_7$, as a function of time (the initial time corresponding to switching of the enabling signal EN from the first value to the second value); as may be noted, the output signal $V_{out}$ has a high ripple, which is entirely due to switching of the clock signal CK, in the hypothesis that the high voltage HV is without any ripple. In fact, the gate terminal of the pass transistor 9 is directly connected to the first capacitor 5, and consequently the output signal $V_{out}$ is directly affected by the voltage fluctuations across the first capacitor 5 due to switching of the clock signal CK. FIG. 3 shows an enlarged portion of the plot of the output signal $V_{out}$, in a time interval wherein it has already reached the desired high-voltage value. As may be noted, the ripple has an amplitude of approximately 600 mVpp.

Such a high ripple proves disadvantageous in all the operating steps of the memory, in particular when the memory is of a multilevel type. In this case, in fact, the ripple leads to a widening of the programmed distributions of the threshold voltages of the memory cells, with a consequent decrease in the noise margin during reading. In the worst case, an excessive widening of the distributions may even lead to read failures.

BRIEF SUMMARY OF THE INVENTION

One embodiment of the present invention provides a high-voltage switch that will enable a solution of the aforementioned problems, and in particular will enable a reduction in the ripple on the high-output voltage which is transmitted to the memory cells.

One embodiment of the present invention is a high-voltage switch that includes a high-voltage input terminal connected to a first reference-voltage line; an output terminal; a pass transistor having a first conduction terminal connected to the high-voltage input terminal, a second conduction terminal connected to the output terminal, and a control terminal; and a boosting stage. The boosting stage has an output connected to the control terminal, and includes a charge-pump, voltage-multiplying circuit. The voltage-multiplying circuit includes first and second charge-storage elements that receive a periodic clock signal. The voltage-multiplying circuit also includes a first circuit branch and a second circuit branch, which are symmetrical to one another and operate in phase opposition with respect to the clock signal.

One embodiment of the invention is a memory device that includes the high-voltage switch.

BRIEF DESCRIPTION OF THE SEVERAL VIEWS OF THE DRAWINGS

For a better understanding of the present invention, there is now described a preferred embodiment thereof, purely by way of non-limiting example and with reference to the attached drawings, in which.

DETAILED DESCRIPTION OF THE INVENTION

Figure 4:
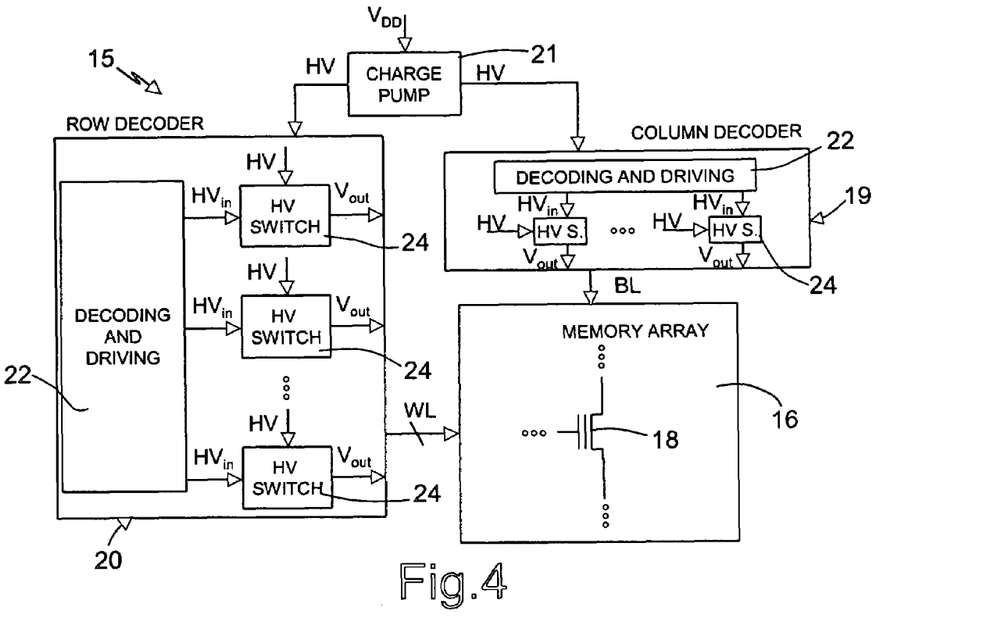
FIG. 4 shows a simplified block diagram of a memory device comprising a high-voltage switch.

As shown in FIG. 4, a floating-gate non-volatile memory device 15, in particular of a NAND flash type, comprises a memory array 16 formed by a plurality of floating-gate memory cells 18, arranged in rows (wordlines WL) and columns (bitlines BL). The memory cells 3 each have their control gate terminal connected to a respective wordline WL, and their drain and source terminals connected to pre-set voltages during the read and modify operations.

The memory device 15 further comprises: a column decoder 19 connected to the bitlines BL; a row decoder 20 connected to the wordlines WL; and a boosting circuit 21, typically of the charge-pump type, connected to the column decoder 19 and row decoder 20.

In a per-se known manner, the boosting circuit 21 receives at input a supply voltage $V_{DD}$ of a low value, for example 3 V, and supplies at output a high voltage HV, for example of 20V, for the column decoder 19 and the row decoder 20. The latter decoders enable selection in reading or modifying (programming or erasing) of one or more memory cells 18 belonging to the memory array 16, on the basis of addresses received from the outside or from other components (not shown) of the memory device 15. In addition, the column decoder 19 and the row decoder 20 supply the voltage and current levels necessary for the read or modify operations to the bitlines BL and wordlines WL, respectively, of the memory cells 18 each time selected.

In particular, the row decoder 20 and the column decoder 19 comprise a respective decoding-and-driving circuit 22, and a respective plurality of high-voltage switches 24. The decoding-and-driving circuit 22 decodes the received addresses for selecting one or more of the wordlines WL or of the bitlines BL and generates suitable driving signals for the selected wordlines WL or bitlines BL. The high-voltage switches 24 are arranged between the decoding-and-driving circuit 22 and a respective wordline WL or bitline BL. Each high-voltage switch 24 receives at input the high voltage HV and a driving voltage $HV_{in}$ (for example of a value higher than or equal to the high voltage HV, if it is necessary to perform a programming operation of the memory cells 18) from the respective decoding-and-driving circuit 22, and supplies an output signal $V_{out}$. As will be described in detail hereinafter, on the basis of the driving voltage $HV_{in}$, and of enabling signals (not illustrated) received at input, the high-voltage switch 24 enables or not the transmission of the high voltage HV to the respective wordline WL or bitline BL.

In detail (reference is now made to FIG. 5), each high-voltage switch 24 has a first input terminal 25, receiving a respective driving voltage $HV_{in}$; a second input terminal 26, receiving a supply voltage $V_{DD}$ of a low value; a third input terminal 27, receiving an enabling signal EN, which can assume a first voltage value, for example zero, and a second voltage value, for example equal to the supply voltage $V_{DD}$; a fourth input terminal 28a and a fifth input terminal 28b, receiving respectively a first disabling signal $DIS_1$ and a second disabling signal $DIS_2$ that can assume a first voltage value, for example zero, and a second voltage value, for example equal to the supply voltage $V_{DD}$; a sixth input terminal 29, receiving the high voltage HV; a seventh input terminal 30, receiving a square-wave periodic clock signal CK; and an output terminal 31 supplying the output signal $V_{out}$.

Figure 5:
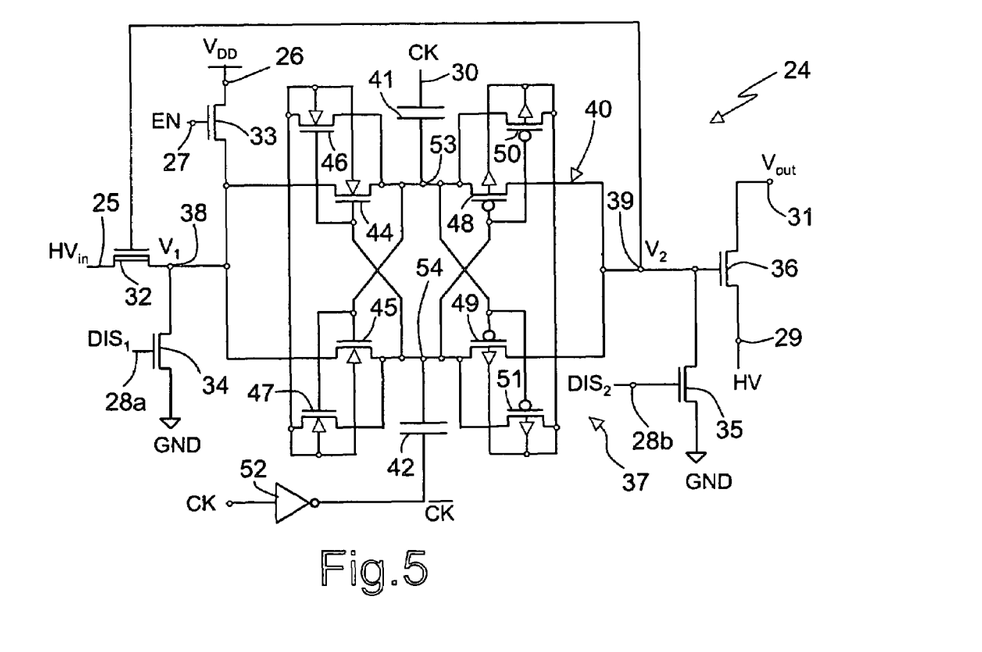
FIG. 5 shows the circuit diagram of the high-voltage switch illustrated in FIG. 4 according to a first embodiment of the present invention.

Furthermore, the high-voltage switch 24 comprises five NMOS transistors of the high-voltage type (feedback transistor 32, turning-on transistor 33, first and second turning-off transistors 34, 35, and pass transistor 36), and a voltage-multiplier stage 37.

In detail, the feedback transistor 32 is connected between the first input terminal 25 and a first internal node 38, set at input to the voltage-multiplier stage 37, and has its gate terminal connected to a second internal node 39, set at the output of the voltage-multiplier stage 37. The feedback transistor 32 is of a natural type, i.e., it has a threshold voltage of a negligible value. The turning-on transistor 33 is connected between the second input terminal 26 and the first internal node 38, and has its gate terminal connected to the third input terminal 27. The first turning-off transistor 34 is connected between the first internal node 38 and a node GND set at the reference voltage, and has its gate terminal connected to the fourth input terminal 28a. The second turning-off transistor 35 is connected between the second internal node 39 and the reference-voltage node GND, and has its gate terminal connected to the fifth input terminal 28b. The pass transistor 36 has its gate terminal connected to the second internal node 39, its first conduction terminal connected to the sixth input terminal 29, and its second conduction terminal connected to the output terminal 31.

The voltage-multiplier stage 37 is arranged between the first internal node 38 and the second internal node 39, and is connected to the seventh input terminal 30. According to a first embodiment of the present invention, the voltage-multiplier stage 37 comprises a voltage doubler 40 of the charge-pump type, and of a symmetrical type (i.e., comprising two circuit branches, which are symmetrical to one another and operate in phase opposition with respect to the clock signal CK).

In detail, the voltage doubler 40 comprises: a first boosting capacitor 41 and a second boosting capacitor 42; a first charge transistor 44 and a second charge transistor 45 and a first biasing transistor 46 and a second biasing transistor 47, of a low-voltage NMOS type; and a first discharge transistor 48 and a second discharge transistor 49 and a third biasing transistor 50 and a fourth biasing transistor 51, of a low-voltage PMOS type. The first circuit branch is constituted by the first charge transistor 44, the first discharge transistor 48, and the first and third biasing transistors 46, 50, whilst the second circuit branch (which is symmetrical to the first circuit branch) is constituted by the second charge transistor 45, the second discharge transistor 49, and the second and fourth biasing transistors 47, 51.

The first boosting capacitor 41 has a first terminal connected to the seventh input terminal 30, and a second terminal connected to a third internal node 53; the second boosting capacitor 42 has a first terminal which is connected to the seventh input terminal 30 via a logic inverter 52 and consequently receives the negated clock signal $\overline{CK}$, and a second terminal connected to a fourth internal node 54.

The first and second charge transistors 44, 45 are connected between the first internal node 34 and, respectively, the third and fourth internal nodes 53, 54; in addition, the gate terminal of the first charge transistor 44 is connected to the fourth internal node 54, and the gate terminal of the second charge transistor 45 is connected to the third internal node 53.

The first and second discharge transistors 48, 49 are connected between the second internal node 39 and, respectively, the third and fourth internal nodes 53, 54; in addition, the gate terminal of the first discharge transistor 48 is connected to the fourth internal node 54, whilst the gate terminal of the second discharge transistor 49 is connected to the third internal node 53.

The first, second, third and fourth biasing transistors 46, 47, 50, 51 have the function of dynamically and appropriately biasing the bulk of the first charge transistor 44, the second charge transistor 45, the first discharge transistor 48 and the second discharge transistor 49, respectively (it is for this reason that in the following they are defined as biasing transistors). In particular, each biasing transistor 46, 47, 50, 51 has its bulk terminal connected to the bulk terminal of a respective transistor, its drain terminal connected to the bulk terminal, its source terminal connected to the source terminal of the respective transistor, and its gate terminal connected to the gate terminal of the respective transistor. In addition, the bulk terminals of the PMOS-type biasing transistors are connected together, as well as the bulk terminals of the NMOS-type biasing transistors.

A description of the operation of the high-voltage switch 24 is now provided.

On the basis of the value of the enabling signal EN and of the first and second disabling signals $DIS_1$ and $DIS_2$, the high-voltage switch 24 enables or not the transfer of the high voltage HV to the output terminal 31, and hence to the respective wordline WL or bitline BL.

In particular, when the first and second disabling signals $DIS_1$, $DIS_2$ have the second voltage value, the high voltage HV is not transferred to the output terminal 31, in so far as the first and second turning-off transistors 34, 35 conduct and keep at an approximately zero value (corresponding to the reference voltage GND) the internal nodes of the high-voltage switch 24; consequently, the pass transistor 36 does not conduct.

When, instead, the enabling signal EN has the second voltage value (and the first and second disabling signals $DIS_1$, $DIS_2$ have the first voltage value), the turning-on transistor 33 conducts, and the voltage of the first internal node 38, designated by $V_1$, is brought to a value of $V_{DD}-V_{th}$, where $V_{th}$ is the threshold voltage of the turning-on transistor 33. Before the clock signal CK starts switching, the voltage of the third internal node 53 and of the fourth internal node 54 is pre-charged to the voltage $V_1$ through the first charge transistor 44 and the second charge transistor 45, respectively. Assuming now that the clock signal CK starts switching from a low value to a high value, corresponding to the supply voltage $V_{DD}$, since the voltage across the first boosting capacitor 41 cannot change instantaneously, the voltage of the third internal node 53 assumes a value of $2V_{DD}-V_{th}$. Consequently, the second charge transistor 45 and the first discharge transistor 48 start conducting, respectively connecting the fourth internal node 54 to the first internal node 38, and the third internal node 53 to the second internal node 39. The second boosting capacitor 42 is charged at the voltage $V_1$ (equal to $V_{DD}-V_{th}$), and the voltage $V_2$ assumes a value equal to the voltage on the third internal node 53 ($2V_{DD}-V_{th}$). Then, after the subsequent switching of the clock signal CK from the high value to the low value, the voltage of the fourth internal node 54 is increased by $V_{DD}$, reaching a value of $2V_{DD}-V_{th}$, and the first charge transistor 44 and the second discharge transistor 49 start conducting, whilst the second charge transistor 45 and the first discharge transistor 48 are turned off. Consequently, the voltage $V_2$ remains at $2V_{DD}-V_{th}$, the second capacitor 42 is discharged towards the second internal node 39, and the first capacitor 41 is charged to the voltage $V_1$. The voltage $V_2$, brought back to the gate terminal of the feedback transistor 32, causes the feedback transistor 32 to start conducting, so that the voltage $V_1$ assumes the same value as the voltage $V_2$ (the feedback transistor 32 is of a natural type and the voltage drop $V_{th}$ across it is zero), thus rising to $2V_{DD}-V_{th}$. Next, at each switching of the clock signal CK, the voltages of the third and fourth internal nodes 53, 54 vary between $V_1$ and $V_1+V_{DD}$, due to the turning-on alternately of the pairs of transistors formed by the first charge transistor 44 and the second discharge transistor 49, and by the second charge transistor 45 and the first discharge transistor 48. At each switching of the clock signal CK, the voltage $V_2$ is further increased by a value equal to the supply voltage $V_{DD}$, until it reaches a value higher than the high voltage HV, causing complete turning-on of the pass transistor 36 and complete transmission of the high voltage HV to the output terminal 31.

In particular, the voltage $V_2$ of the second internal node 39, once the transient is completed, is $HV_{in}+V_{DD}$, and the output voltage $V_{out}$ is approximately HV.

In particular, the feedback transistor 32 at most lets a voltage equal to the voltage that it receives on the gate terminal pass onto the first internal node 38, and hence the voltage difference across each MOS transistor of the multiplier stage 37 never exceeds $V_{DD}$, and all the internal nodes of the multiplier stage 37 evolve in a range of $V_{DD}$. For this reason, the NMOS and PMOS transistors of the voltage-multiplier stage 37 can be of the low-voltage type.

Furthermore, the symmetrical configuration of the high-voltage switch 24 means that the second internal node 39 is not connected directly to the first boosting capacitor 41 and to the second boosting capacitor 42 and hence does not feel the oscillations due to the switching of the clock signal CK directly. In particular, the voltage $V_2$ is equal to $V_1+V_{DD}$ both during the first half-period and during the second half-period of the clock signal CK on account of the conduction in phase opposition of the first discharge transistor 48 of the first circuit branch (in a first half-period of the clock signal CK) and of the second discharge transistor 49 of the second circuit branch (in a second half-period of the clock signal CK). Consequently, the ripple on the output voltage $V_{out}$ is limited, and the output voltage $V_{out}$ is particularly stable.

Figure 6:
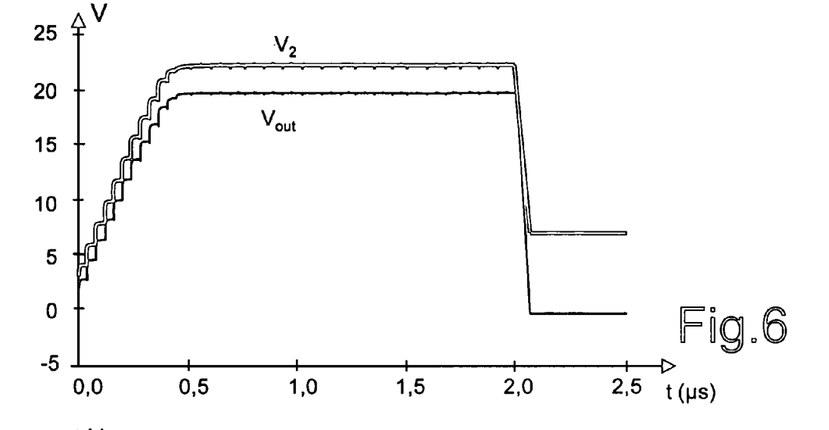
FIGS. 6 and 7 show plots of circuit quantities of the circuit illustrated in FIG. 5.
Figure 7:
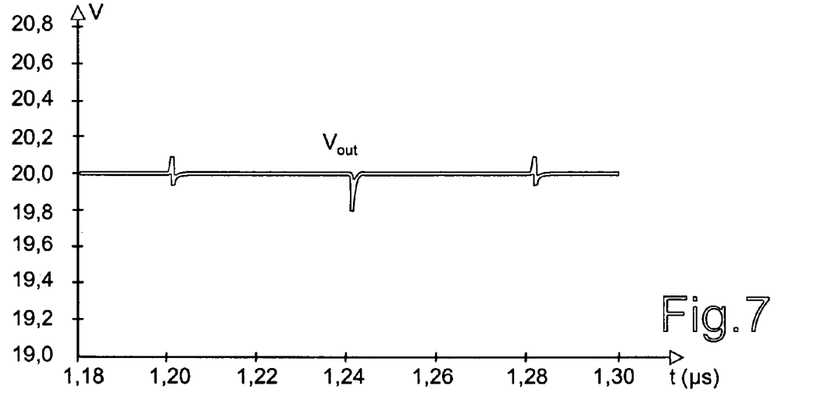

FIG. 6 shows the time plot of the voltage $V_2$ and of the output voltage $V_{out}$, whilst FIG. 7 shows an enlarged portion of the plot of the output voltage $V_{out}$. From the comparison with FIGS. 2, 3, it is evident the reduction in the ripple at the output of the high-voltage switch 24, which does not exceed in this case the value of 200 mVpp, whilst the rise time (i.e., the time interval in which the transient is exhausted and the output voltage $V_{out}$ reaches the high voltage HV) is comparable.

The advantages of the high-voltage switch and of the memory device according to the present invention are clear from the foregoing description.

It is in any case emphasized that the circuit disclosed enables the same performance in terms of rise time of the output signal as compared to traditional circuits to be obtained, albeit enabling a up to 66% reduction in the ripple. The particular circuit configuration enables use of transistors of the low-voltage type for the voltage-multiplier stage. Furthermore, the area occupied by the high-voltage switch is smaller than or equal to that of traditional circuits.

Finally, it is clear that modifications and variations can be made to the high-voltage switch described and illustrated herein, without thereby departing from the scope of the present invention, as defined in the appended claims.

Figure 8:
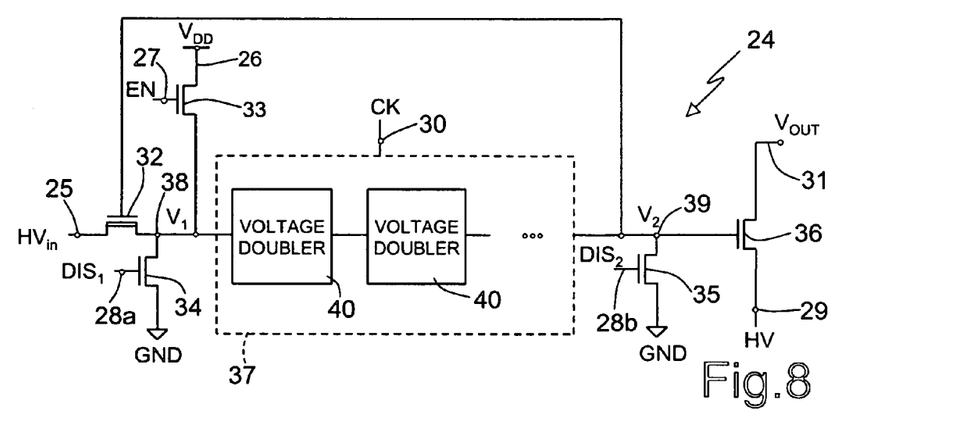
FIG. 8 shows the circuit diagram of a second embodiment of the high-voltage switch illustrated in FIG. 4.

In particular, according to a further embodiment of the present invention, shown in FIG. 8, the voltage-multiplier stage 37 comprises a plurality of voltage-doubler circuits 40 cascaded between the first and second internal nodes 38, 39, each of which increases by $V_{DD}$ the voltage that it receives at input. The voltage $V_2$ of the gate terminal of the pass transistor 36 is thus greater than in the case of a single voltage-doubler circuit 40 (in fact, when the transient is exhausted, $V_2$ is equal to $HV_{in}+nV_{DD}$, where n is the number of voltage-doubler circuits 40 connected in cascaded fashion). Furthermore, the on-resistance $R_{DSon}$ of the pass transistor 36 is smaller (the pass transistor 36 is in a state of higher conduction), and the time for transfer of the high voltage HV at output is reduced. Consequently, by varying the number of voltage-doubler circuits 40, it is possible to control the way in which the high voltage HV is transferred to the memory cells, which can thus be adapted (i.e., made slower or faster) according to the specific operating requirements of the memory.

Furthermore, also the frequency of the clock signal CK can be adjusted so as to increase or decrease the speed of transfer of the high voltage HV to the output.

Figure 9:
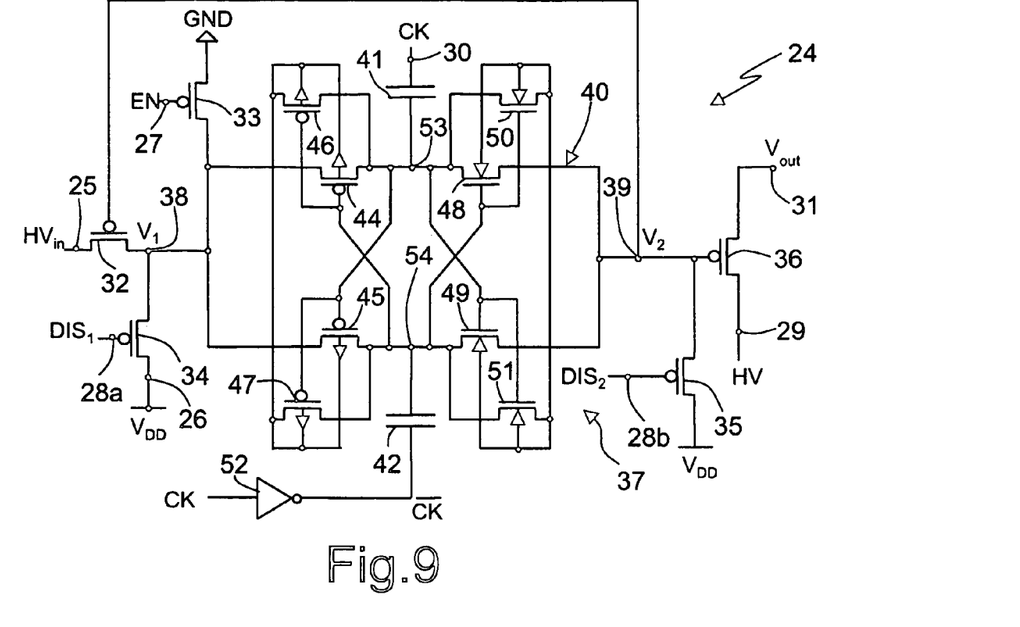
FIG. 9 shows the circuit diagram of a third embodiment of the high-voltage switch illustrated in FIG. 4.

According to a further embodiment of the present invention, shown in FIG. 9, the high-voltage switch 24 can be modified in order to accept at input a negative voltage $HV_{in}$ and to transfer at output a negative high voltage HV. In this case, the high-voltage switch 24 is exactly dual with respect to the circuit illustrated in FIG. 5 (in particular the NMOS transistors are replaced by PMOS transistors, and the connections to the supply voltage $V_{DD}$ are replaced by connections to the reference-voltage node GND, and vice versa). Again, by varying the number of doubler circuits 40 or the frequency of the clock signal CK, it is possible to control the way in which the high voltage HV is transferred to the output.

Figure 10:
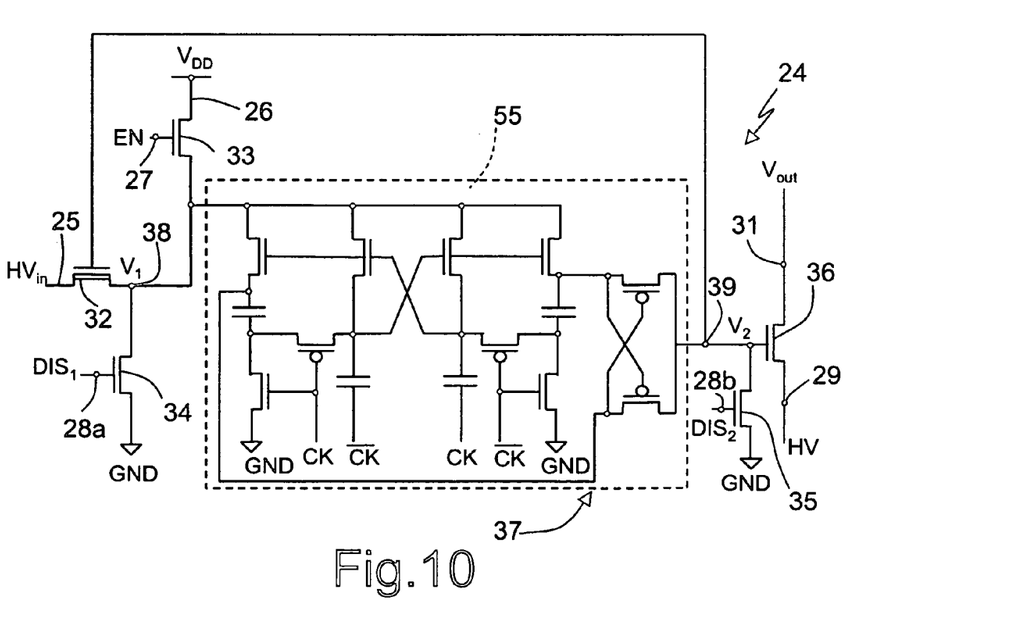
FIG. 10 shows the circuit diagram of a fourth embodiment of the high-voltage switch illustrated in FIG. 4.

Furthermore, as shown in FIG. 10, the voltage-multiplier stage 37 can comprise a charge-pump voltage tripler 55 of a symmetrical type, to make faster the transfer of the high voltage HV to the output. The circuit diagram of the voltage tripler 55, which is per-se known, is not described in detail.

In addition, the feedback transistor 32 at input may not be of a natural type, with the drawback of having a voltage drop across it, due to a non-zero threshold voltage.

Finally, it is clear that the high-voltage switch disclosed can be advantageously used in other types of memories (for example, in NOR-type flash memories, wherein it is necessary to transfer high negative voltages to the memory cells), or more in general in other applications not concerning memories, in all cases where a control in the transfer of a high voltage (whether positive or negative) to a load is required.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. A high-voltage switch, comprising:
 a high-voltage input terminal connected to a first reference-voltage line to receive a high voltage that is higher than a supply voltage to the switch;
 an output terminal;
 a pass transistor having a first conduction terminal connected to said high-voltage input terminal, a second conduction terminal connected to said output terminal, and a control terminal;
 a boosting stage having an output connected to said control terminal, and including a charge-pump, voltage-multiplying circuit; said voltage-multiplying circuit comprising first and second charge-storage elements, which receive a periodic clock signal; wherein said voltage-multiplying circuit includes a first circuit branch and a second circuit branch couplable to the output, which are symmetrical to one another and operate in phase opposition with respect to said clock signal;
 a driving input terminal connected to a second reference-voltage line; and
 a feedback transistor, connected between said driving input terminal and an input of said boosting stage and having a control terminal connected to said output of said boosting stage.

2. The high-voltage switch according to claim 1, wherein said clock signal has a first half-period and a second half-period, and said output of the boosting stage is connected to said first circuit branch in the first half-period and to said second circuit branch in the second half-period.

3. The high-voltage switch according to claim 1, wherein said voltage-multiplying circuit is a voltage-doubler circuit.

4. The high-voltage switch according to claim 1, wherein:
said first charge-storage element includes a first boosting capacitor, receiving said clock signal on a first terminal and having a second terminal connected to a first charge-transfer node;
said second charge-storage element includes a second boosting capacitor, receiving, on a first terminal, a negated signal in phase opposition with said clock signal, and having a second terminal connected to a second charge-transfer node;
said first circuit branch comprises a first charge transistor, connecting said first charge-transfer node to an input of said boosting stage and having a control terminal connected to said second charge-transfer node, and a first discharge transistor, connecting said first charge-transfer node to said output of said boosting stage and having a control terminal connected to said second charge-transfer node; and
said second circuit branch comprises a second charge transistor, connecting said second charge-transfer node to said input of said boosting stage and having a control terminal connected to said first charge-transfer node, and a second discharge transistor, connecting said second charge-transfer node to said output of said boosting stage and having a control terminal connected to said first charge-transfer node; said first charge transistor and second charge transistor having a first type of polarity, and said first discharge transistor and second discharge transistor having a second type of polarity.

5. The high-voltage switch according to claim 1, wherein said boosting stage comprises at least one further voltage-multiplying circuit cascaded to said voltage-multiplying circuit.

6. The high-voltage switch according to claim 1, wherein said voltage-multiplying circuit is a voltage-tripler circuit.

7. The high-voltage switch according to claim 1, wherein said feedback transistor is a natural transistor.

8. The high-voltage switch according to claim 1, wherein said second reference-voltage line is set at a voltage having an absolute value not lower than said first reference-voltage line.

9. The high-voltage switch according to claim 1, further comprising:
a supply input terminal connected to a second reference-voltage line set at a voltage lower than said first reference-voltage line;
an enabling input terminal receiving an enabling signal of a logic type; and
a turning-on transistor, connected between said supply input terminal and said input of said boosting stage and having a control terminal connected to said enabling input terminal.

10. The high-voltage switch according to claim 1, further comprising
a first disabling input terminal and a second disabling input terminal, receiving, respectively, a first turning-off signal and a second turning-off signal;
a first turning-off transistor, connected between said input of said boosting stage and a second reference-voltage line and having a control terminal connected to said first disabling input terminal; and
a second turning-off transistor, connected between said output of said boosting stage and said second reference-voltage line and having a control terminal connected to said second disabling input terminal.

11. The high-voltage switch according to claim 1, wherein said clock signal has a frequency which can be adjusted.

12. A floating-gate non-volatile memory device, comprising:
an array of memory cells; and
a first high-voltage switch that includes:
a high-voltage input terminal connected to a first reference-voltage line;
an output terminal;
a pass transistor having a first conduction terminal connected to said high-voltage input terminal, a second conduction terminal connected to said output terminal, and a control terminal;
a boosting stage having an output connected to said control terminal, and including a charge-pump, voltage-multiplying circuit; said voltage-multiplying circuit comprising first and second charge-storage elements, which receive a periodic clock signal;
wherein said voltage-multiplying circuit includes a first circuit branch and a second circuit branch, which are symmetrical to one another and operate in phase opposition with respect to said clock signal;
a driving input terminal connected to a second reference-voltage line; and
a feedback transistor, connected between said driving input terminal and an input of said boosting stage and having a control terminal connected to said output of said boosting stage.

13. The memory device according to claim 12, wherein the array of memory cells is organized in a plurality of wordlines and bitlines, the device further comprising:
a row decoder connected to said wordlines and including a first plurality of high-voltage switches connected to the wordlines, respectively; and
a column decoder connected to said bitlines and including a second plurality of high-voltage switches connected to said bitlines, respectively, wherein the first high-voltage switches is one of the high-voltage switches in the first and second pluralities.

14. The memory device according to claim 12, wherein:
the first charge-storage element includes a first boosting capacitor, receiving the clock signal on a first terminal and having a second terminal connected to a first charge-transfer node;
the second charge-storage element includes a second boosting capacitor, receiving, on a first terminal, a negated signal in phase opposition with the clock signal, and having a second terminal connected to a second charge-transfer node;
the first circuit branch comprises a first charge transistor, connecting the first charge-transfer node to the input of the boosting stage and having a control terminal connected to the second charge-transfer node, and a first discharge transistor, connecting the first charge-transfer node to the output of the boosting stage and having a control terminal connected to the second charge-transfer node; and
the second circuit branch comprises a second charge transistor, connecting the second charge-transfer node to the input of the boosting stage and having a control terminal connected to the first charge-transfer node, and a second discharge transistor, connecting the second charge-transfer node to the output of the boosting stage and having a control terminal connected to the first charge-transfer node; the first charge transistor and second charge transistor having a first type of polarity, and the first discharge transistor and second discharge transistor having a second type of polarity.

15. A high-voltage switch, comprising
a high-voltage input terminal connected to a first reference-voltage line to receive a high voltage that is greater than a supply voltage;
an output terminal;
a pass transistor having a first conduction terminal connected to the high-voltage input terminal, a second conduction terminal connected to the output terminal, and a control terminal;
a boosting stage including:
   an input receiving a voltage to be boosted;
   an output connected to the control terminal;
   first and second charge-storage elements connected to first and second charge-transfer nodes, respectively;
   a first charge transistor connected between the input and the first charge-transfer node;
   a second charge transistor connected between the input and the second charge-transfer node;
a driving input terminal connected to a second reference-voltage line; and
a feedback transistor connected between the driving input terminal and the input of the boosting stage and having a control terminal connected to the output of the boosting stage, the feedback transistor further coupled to the second reference voltage line.

16. The high-voltage switch according to claim 15, further comprising:
a first discharge transistor connecting the first charge-transfer node to the output of the boosting stage and having a control terminal connected to the second charge-transfer node; and
a second discharge transistor connecting the second charge-transfer node to the output of the boosting stage and having a control terminal connected to the first charge-transfer node.

17. The high-voltage switch according to claim 15, further comprising:
a first biasing transistor having a first conduction terminal, a second conduction terminal connected to the first charge-transfer node, a control terminal connected to the second charge-transfer node, and a bulk terminal connected to a bulk terminal of the first charge transistor; and
a second biasing transistor having a first conduction terminal connected to the first conduction terminal of the first biasing transistor, a second conduction terminal connected to the second charge-transfer node, a control terminal connected to the first charge-transfer node, and a bulk terminal connected to a bulk terminal of the second charge transistor.

18. The high-voltage switch according to claim 15, wherein the first charge-storage element is connected between a first clock input and the first charge-transfer node and the second charge-storage element is connected between a second clock input and the second charge-transfer node, the second clock input receiving a clock signal that is inverted compared to a clock signal at the first clock input.

19. The high-voltage switch according to claim 15, wherein the feedback transistor is a natural transistor.

20. The high-voltage switch according to claim 15, wherein the second reference-voltage line is set at a voltage having an absolute value not lower than the first reference-voltage line.

21. The high-voltage switch according to claim 15, further comprising:
a supply input terminal connected to a third reference-voltage line set at a voltage lower than the first reference-voltage line;
an enabling input terminal receiving an enabling signal of a logic type; and
an enabling transistor connected between the supply input terminal and the input of the boosting stage and having a control terminal connected to the enabling input terminal.

22. The high-voltage switch according to claim 15, further comprising
a first disabling input terminal and a second disabling input terminal, receiving, respectively, a first disabling signal and a second disabling signal;
a first disabling transistor connected between the input of the boosting stage and a third reference-voltage line and having a control terminal connected to the first disabling input terminal; and
a second disabling transistor connected between the output of the boosting stage and the third reference-voltage line and having a control terminal connected to the second disabling input terminal.

* * * * *